(12) United States Patent
Ewald

(10) Patent No.: US 12,355,380 B2
(45) Date of Patent: Jul. 8, 2025

(54) INVERTER STRUCTURE OF AN INVERTER OF A POWER ELECTRONICS MODULE FOR OPERATING AN ELECTRIC DRIVE OF A MOTOR VEHICLE

(71) Applicant: ZF Friedrichshafen AG, Friedrichshafen (DE)

(72) Inventor: Ake Ewald, Bayreuth (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 143 days.

(21) Appl. No.: 18/455,916

(22) Filed: Aug. 25, 2023

(65) Prior Publication Data
US 2024/0072708 A1  Feb. 29, 2024

(30) Foreign Application Priority Data
Aug. 26, 2022 (DE) .......................... 102022208840.9

(51) Int. Cl.
| | |
|---|---|
| *H02M 1/084* | (2006.01) |
| *H02K 9/22* | (2006.01) |
| *H02P 27/06* | (2006.01) |

(52) U.S. Cl.
CPC .............. *H02P 27/06* (2013.01); *H02K 9/22* (2013.01)

(58) Field of Classification Search
CPC .......... H02P 27/06; H02K 9/22; H02M 7/003; H02M 1/00; H02M 7/53871; H05K 7/20927
See application file for complete search history.

(56) References Cited

U.S. PATENT DOCUMENTS

2021/0126546 A1* 4/2021 Sperber ................ H02M 7/003

FOREIGN PATENT DOCUMENTS

DE    10 2011 050 404 A1    11/2011

OTHER PUBLICATIONS

Office Action dated May 25, 2023 for German Patent Application No. 10 2022 208 840.9 (16 pp.), note: pp. 1 and 2 are English language Explanations to Section C. Result of Determination Document.

* cited by examiner

*Primary Examiner* — Muhammad S Islam
(74) *Attorney, Agent, or Firm* — Crowell & Moring LLP

(57) ABSTRACT

An inverter includes at least one phase and two driver boards situated opposite each other, and at least one half-bridge, arranged between the driver boards and contacted electrically and/or by signals, with, in each case, a semiconductor package formed as a high-side switch and a semiconductor package arranged parallel thereto and formed as a low-side switch. A heat sink in the region of the half-bridges and connected to a cooling attachment under each semiconductor package, wherein the heat sink has a split design so that a first cooling branch is arranged in the high-side branch and a second cooling branch is arranged in the low-side branch, wherein the cooling branches are arranged at a distance from each other, and the cooling branches are fluidically interconnected in parallel or in series in a region outside the arrangement of the semiconductor packages.

18 Claims, 4 Drawing Sheets

INVERTER STRUCTURE OF AN INVERTER OF A POWER ELECTRONICS MODULE FOR OPERATING AN ELECTRIC DRIVE OF A MOTOR VEHICLE

CROSS-REFERENCE TO RELATED APPLICATION

This application claims priority to German Application No. DE 10 2022 208 840.9, filed on Aug. 26, 2022, the entirety of which is hereby fully incorporated by reference herein.

FIELD

The present invention relates to the field of electromobility, in particular electronic modules for an electric drive.

BACKGROUND AND SUMMARY

The use of electronic modules, for example power electronics modules, in motor vehicles has increased markedly in recent decades. This can be attributed, on the one hand, to the need to improve fuel economy and the vehicle power and, on the other hand, to progress in semiconductor technology. A prominent example of such electronic modules is represented by DC/AC inverters which serve to supply electric machines such as electric motors or generators with a multiphase alternating current. Direct current generated by means of a DC energy source, for example a battery, is here converted into a multiphase alternating current. For this purpose, the electronic modules comprise a plurality of electronic components with which bridge circuits (for example half-bridges) are implemented, for example semiconductor power switches which are also referred to as power semiconductors.

In previously known arrangements of inverters, power semiconductors, i.e. semiconductor power switches in the form of high-side switches HS or low-side switches LS, which together form a half-bridge are arranged one behind the other starting from the intermediate circuit capacitor. In other words, they are not arranged next to one another and instead are situated opposite one another with their electrical contact connections at which the AC current is tapped such that, for example, the electrical contact connection of the HS is closer to the intermediate circuit than that of the LS.

Inverters in automobile manufacture have to be adapted to different performance classes in the vehicle. This means that different currents have to be supplied by the inverter. In many cases, it is not economically expedient to design an adapted module with the associated power electronics for each performance class. For this reason, either discrete power switches or a plurality of power modules are used in parallel in order to achieve the required performance class. For example, a plurality of half-bridges, for example four per electrical phase, are arranged next to one another such that the inverter is a total of twelve half-bridges "long". A disadvantage here is that, in the case of a plurality of parallel modules, the dimensions of the inverter increase significantly.

Moreover, approaches already exist in which two power electronics modules are connected in parallel which are arranged opposite each other per phase on the heat sink. A disadvantage of this arrangement is that in this variant only a maximum of two power electronics modules (also modules for short) connected in parallel are possible without the inverter becoming significantly longer. Furthermore, only an even number of modules is possible. It is moreover disadvantageous that complex mounting of the components is necessary because a plurality of DC and AC connection positions have to be tapped there.

Because there is a constantly increasing need for improvement in the structure of the inverter, an object of the invention is therefore to overcome the described disadvantages at least partially. This object is achieved by the described structure of an inverter and the use of the latter in a vehicle according to the present disclosure. Advantageous embodiments are also the subject matter of the present disclosure.

Proposed is an inverter structure of an inverter of a power electronics module for activating an electric drive of a motor vehicle, wherein the inverter has: at least one phase and two driver boards situated opposite each other, and at least one half-bridge, arranged between the driver boards and thus contacted electrically and/or by signals, with in each case a semiconductor package formed as a high-side switch and a semiconductor package arranged parallel thereto and formed as a low-side switch, wherein the high-side switch forms a high-side branch and the low-side switch forms a low-side branch, and at least one heat sink in the region of the half-bridges and connected thermally conductively to a cooling attachment situated on an underside of each semiconductor package, wherein the heat sink has a split design in such a way that at least a first cooling branch thereof is arranged in the high-side branch and at least a second cooling branch thereof is arranged in the low-side branch on the associated semiconductor package. The first cooling branch of the high-side branch and the second cooling branch of the low-side branch are arranged at a distance from each other and the first cooling branch and the second cooling branch are fluidically interconnected in parallel or in series in a region outside the arrangement of the semiconductor packages.

The heat sink is expediently designed for the throughflow of a coolant, for example a liquid or a gas. If the cooling branches are connected in parallel, the coolant is split, wherein some of the coolant flows through one cooling branch and the rest of the coolant flows through the other cooling branch. If the cooling branches are connected in series, the coolant flows first through one cooling branch and then through the other cooling branch.

In one embodiment, in the case of multiple phases, each cooling branch has a fastening to one of the driver boards between the phases.

In one embodiment, each cooling branch is dimensioned in such a way that its width corresponds to no more than the length of the cooling attachment between the AC and DC tapping point of the semiconductor package.

In one embodiment, the semiconductor packages are arranged parallel to each other and all the parallel semiconductor packages of a phase are arranged on the same side of the associated cooling branch.

In one embodiment, the inverter has three phases, and wherein an additional phase is provided at a region of the cooling branch on which no semiconductor package is present.

In one embodiment, at least one further component is connected thermally conductively to the cooling branch at a region of the cooling branch on which no semiconductor package is present and is configured to supply active or passive discharging.

In one embodiment, semiconductor packages of a branch are arranged on mutually opposite sides of heat sinks of the respective cooling branch.

In one embodiment, AC tapping points of the semiconductor packages of the low side and the high side are connected at a common connection point.

In one embodiment, one, two, three, or four half-bridges are provided per phase.

In one embodiment, the semiconductor packages are arranged in such a way that its DC connector faces an intermediate circuit capacitor to be connected thereto, or wherein the DC connectors have an angle of essentially 90 degrees to the intermediate circuit capacitor to be connected thereto.

In one embodiment, semiconductor packages are arranged on mutually opposite sides of heat sinks of the associated cooling branch, and a structural height of the heat sink is selected such that DC busbars of the semiconductor packages are connected at a common connection point and can be electrically contacted with an intermediate circuit.

Also proposed is the use of an inverter structure of an inverter in a power electronics module for activating an electric drive of a motor vehicle equipped with an electric drive.

Also proposed is a power electronics module with an inverter with the described inverter structure. Likewise proposed is an electric drive, in particular an electric axle drive, for a motor vehicle with at least one electric machine, a transmission device and the power electronics module, and a motor vehicle with the electric drive.

Further features and advantages of the invention can be found in the following description of exemplary embodiments of the invention with the aid of the Figures in the drawings which show the details according to the invention, and in the claims. The individual features can each be implemented individually per se or jointly in any desired combination in a variant of the invention.

Preferred embodiments of the invention are explained in detail below with the aid of the attached drawings.

DETAILED DESCRIPTION

Figure 1:
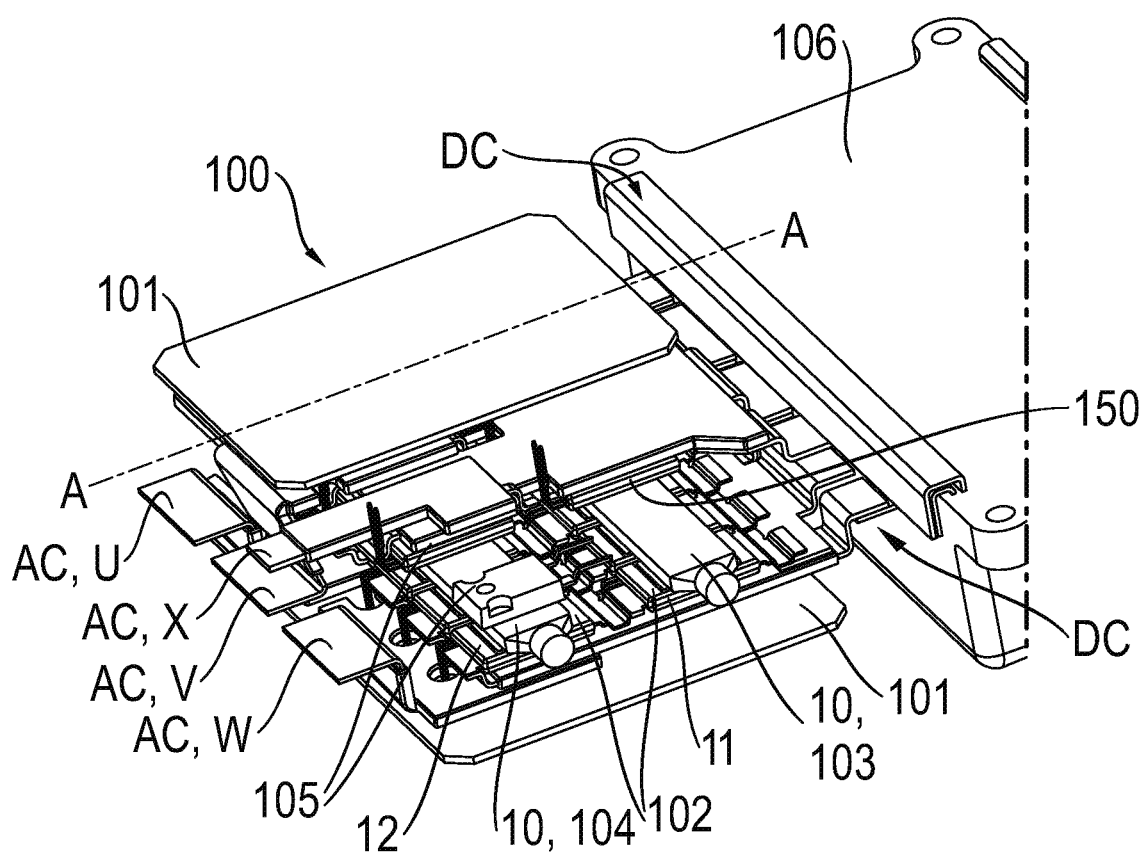
FIG. 1 shows an oblique view of a power electronics module with an inverter with four phases according to an embodiment of the present invention.

The same elements or functions are provided with the same reference signs in the following descriptions of the Figures.

As already mentioned at the beginning, an object of the present disclosure is to supply an improved inverter structure of an inverter 1 of a power electronics module 100 for activating an electric drive of a motor vehicle 200.

The inverter structure described below affords many advantages: namely, on the one hand, that, compared with solutions in the prior art, it is possible for both sides to be populated with the heat sink 10 without there being any need for additional structural space in the inverter height. Moreover, the two split cooling branches 103, 104 for high-side and low-side switches serve to minimize problems with the clearance and creepage distance. The "length" of the inverter 1 also grows more slowly in the case of a higher number of parallel connections than in the prior art, wherein attachment to the intermediate circuit (capacitor) can be implemented in a similar way to the prior art. The attachment of the DC busbars DC to the intermediate circuit 106, and the AC attachment of the AC busbars AC takes place at the same height.

The basic structure of the power electronics module 100 will first be described with reference to FIGS. 1 and 2 (section along A-A in FIG. 1). The power electronics module 100 has two mutually opposite driver boards 101 and at least one half-bridge 102, arranged between the driver boards 101 and contacted therewith electrically and/or by signals, with in each case a semiconductor package 11, 12 formed as a high-side switch and one formed as a low-side switch. Reference will be made below to "the half-bridges 102", wherein only a single half-bridge 102 is also to be understood thereby.

Busbars DC and AC for electrically contacting the semiconductor package 11, 12 are moreover provided between the driver boards 101. The high-side switches form a high-side branch and the low-side switches form a low-side branch. The power switches (low-side switches and high-side switches) of each half-bridge 102 are arranged and interconnected in parallel to each other. Their AC tapping points advantageously face one another (in FIG. 1 between the power switches 11 and 12 and the cooling branches 103, 104 arranged thereon), whereas the DC tapping points each face an opposite outer side. The DC busbars DC and the AC busbar AC are then connected to the tapping points in such a way that they are arranged opposite each other, i.e. in each case face in opposite directions from the power electronics module 100 (the AC busbar on the left and the DC busbars on the right in FIG. 1).

Figure 7:
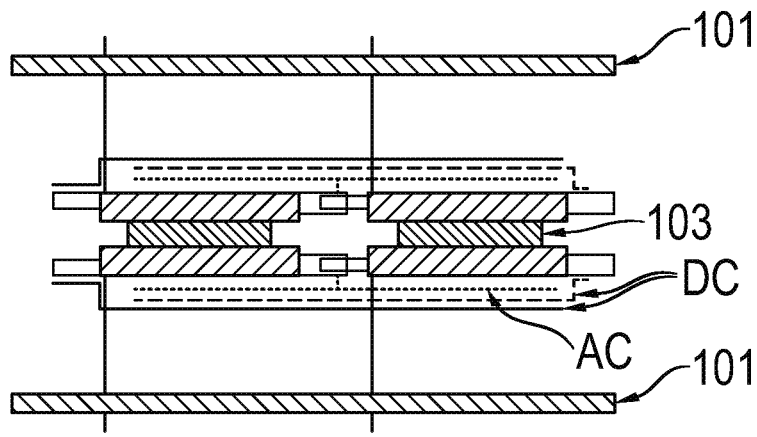
Figure 8:
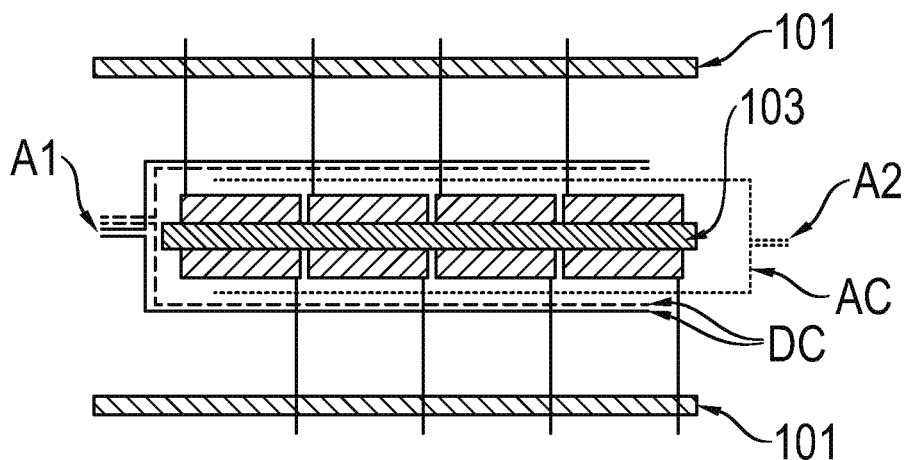

The half-bridges 102 are advantageously positioned in such a way that the DC busbars DC face in the direction of the intermediate circuit 106 in order to implement a connection which is as short as possible. In an alternative embodiment, the half-bridges 102 can, however, also be rotated by 90 degrees, wherein a suitable busbar configuration for the busbars DC, AC, as shown for example in FIGS. 7 and 8, is then advantageous here.

The semiconductor packages 11, 12 have a cooling attachment 111, 121 on one of their (large) surfaces, referred to below as the underside. This cooling attachment 111, 121 serves for the conductive, i.e. thermal attachment of the heat sink 10, in particular by face-to-face contact. The cooling attachment 111, 121 serves to thermally conduct waste heat, for the purpose of dissipating it, from the semiconductor packages 11, 12 into the heat sink 10. The cooling attachment 111, 121 has a specified length and width, wherein the width is defined in this context as the width between the tapping points of each semiconductor package 11, 12. The width is generally less than the width of the semiconductor package 11, 12.

As already mentioned, a heat sink 10 is provided on the semiconductor packages 11, 12. However, it is not, as usual, formed as a single heat sink 10 over all the semiconductor packages 11, 12 and instead is split into two cooling branches 103, 104 spaced apart from each other in the region between the semiconductor packages 11, 12 of the half-bridge(s) 102, as can be seen in FIGS. 1 and 2. No full-surface cooling plate is thus provided. One of the cooling branches 103, 104 is assigned to the low-side branch (the cooling branch 104 in FIGS. 1 and 2) and hence to the corresponding semiconductor packages 12, and the other is assigned to the high-side branch (the cooling branch 103 in FIGS. 1 and 2) and hence to the corresponding semiconductor packages 11, i.e. conductively connected to the cooling attachments 111, 121 of the respective semiconductor packages 11, 12. In one embodiment, a plurality of semiconductor packages 11, 12 are arranged at least in some instances on both sides along the respective cooling branch 103, 104. The cooling branch 103 is thus arranged at least in some instances between two semiconductor packages 11 situated opposite each other. The cooling branch 104 is thus arranged at least in some instances between two semiconductor packages 12 situated opposite each other. A plurality of semiconductor packages 11, 12 are preferably arranged in each case in pairs situated opposite each other on the respective cooling branch 103, 104. All the semiconductor packages arranged on a cooling branch are favorably either part of the high-side branch or part of the low-side branch.

Figure 10:
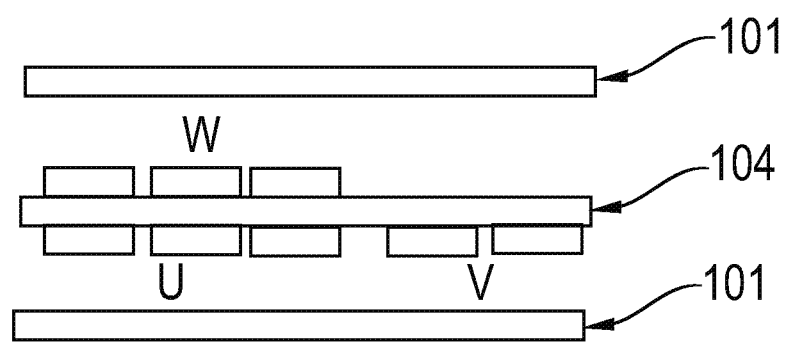
FIG. 10 shows a schematic view of an embodiment of the present invention.

As illustrated in FIG. 10, in a preferred embodiment, semiconductor packages 11, 12 of two phases U, V are arranged on one side of a cooling branch 103, 104, and semiconductor packages 11, 12 of a third phase W are arranged on the opposite side of the cooling branch 103, 104. A saving of a third of the previously required width of the power electronics module 100 can thus be made. The side of the cooling branch 103, 104 on which two phases U, V are arranged is here preferably occupied completely, i.e. over the whole length of the cooling branch 103, 104, with semiconductor packages 11, 12. The opposite side can here be occupied completely, i.e. over the whole length of the cooling branch 103, 104, or partially with the third phase W. If it is only partially occupied, space is free for further components on the cooling branch 103, 104. Such further components can be a fourth phase X as an excitation phase of a separately excited synchronous machine, or other components which need to be cooled, as described below.

As indicated in FIG. 10, a different number of semiconductor packages 11, 12 can be provided per phase U, V, W.

The AC busbars of the phases U, V, the semiconductor packages 11, 12 of which are arranged on the same side of the cooling branch 103, 104, do not have to, as illustrated in the Figures, lie directly next to each another, whilst the AC busbar of the phase W, which lies on the opposite side of the cooling branch 103, 104, lies completely on the outside. Instead, it can be arranged depending on the available structural space. It is advantageous if it (AC busbar of the phase W in FIG. 10) were to lie centrally between the other two (AC busbars of the phases U and V in FIG. 10) in order to supply a symmetrical attachment to the intermediate circuit 106.

The cooling branches 103, 104 are spaced apart from each other (arranged at a distance from each other) in the region between the half-bridges 102, i.e. in the region of the two facing AC tapping points of the semiconductor packages 11, 12 connected in parallel, and are not connected to each other there. The heat sink 10, to be more precise each cooling branch 103, 104, is advantageously formed in such a way that it guides inside it a coolant in the form of a liquid of a gas which serves to dissipate heat. In order to establish a fluid circuit, the cooling branches have an inflow and an outflow. Each of the cooling branches can have its own inflow and outflow. The inflow and outflow are advantageously fluidically connected to each other in parallel or in series in a region outside the semiconductor packages 11, 12 (not shown). The precise type of connection will be chosen by a person skilled in the art depending on the configuration of the inverter.

Figure 2:
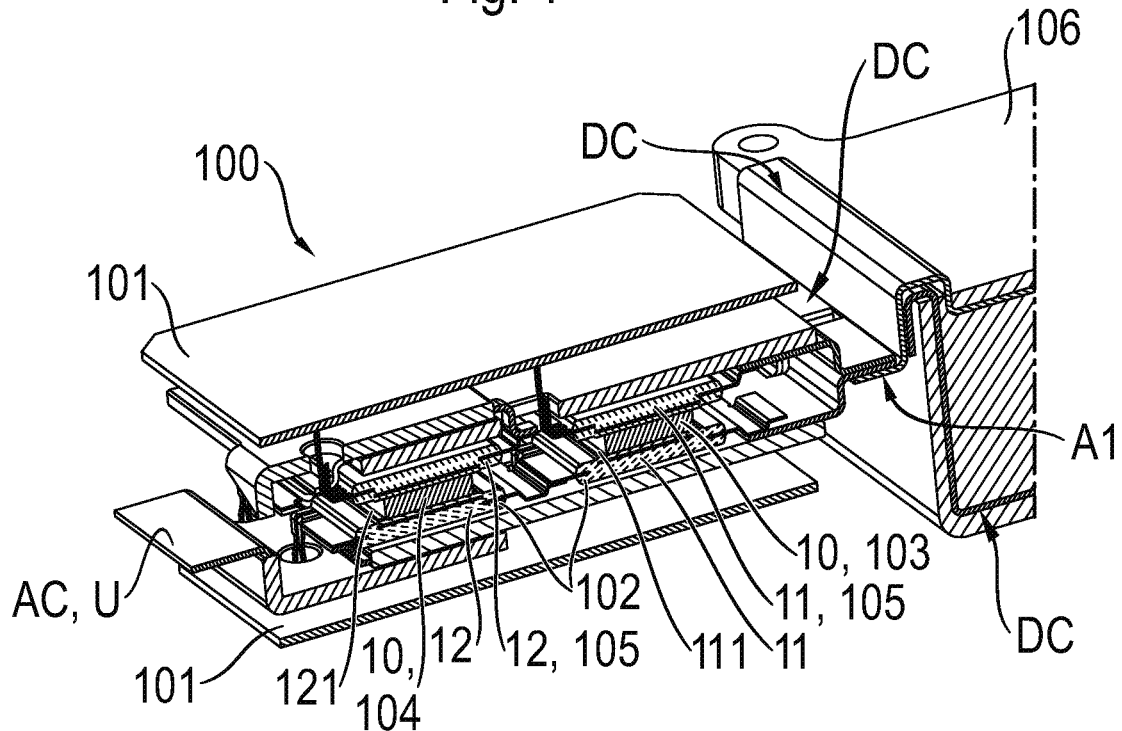
FIG. 2 shows an oblique view of a section along the line A-A of the power electronics module shown in FIG. 1.

The width of each cooling branch 103, 104 corresponds to no more than the width of the cooling attachment 111, 121, as can be seen in FIGS. 1 and 2. The length depends on whether the cooling branch 103, 104 is formed continuously over all phases U, V, W of the inverter 1, or whether it is provided so that it is split per phase U, V, W. The length moreover depends on the number of semiconductor packages 11, 12 used. A continuous cooling branch 103, 104, as shown in FIG. 1, comprises an inflow and an outflow as well as a contacting region lying between them which is suitable for the thermal contacting of the semiconductor packages 11 and 12. A split cooling branch comprises an inflow and an outflow as well as a plurality of contacting regions lying between them which are suitable for the thermal contacting of the semiconductor packages 11 and 12, as well as connecting sections which connect the different contacting regions to one another. A continuous cooling branch 103, 104 is preferably designed as a single part. A split cooling branch can be designed both as a single part and as multiple parts. If the cooling branch 103, 104 is formed so that it is split per phase U, V, W and in multiple parts per high-side and low-side branch, the individual parts of the cooling branch 103 are fluidically connected to one another and the individual parts of the cooling branch 104 are fluidically connected to one another, as indicated schematically in FIGS. 3 to 5. However, the two cooling branches 103, 104 are furthermore fluidically connected to each other only outside the half-bridges 102.

In the case of a plurality of phases U, V, W being present, each cooling branch 103, 104 or each part of a cooling branch 103, 104 have a fastening to one of the driver boards 101 between the phases U, V, W in order to prevent vibrations in the system.

In one embodiment, the semiconductor packages 11, 12 are arranged per phase U, V, W on the same or both sides of the heat sink 10. A subregion of the heat sink 10 can here remain free and be used for other components 105 to be cooled, such as, for example, components for passive or active discharge (RAD). An additional phase X (a fourth phase in FIGS. 1 and 2) can moreover be provided in order to employ, for example, a separately excited synchronous machine. One or more semiconductor packages of this additional phase X are, however, not provided for operating the electromotive drive. Instead, this additional phase X serves to operate other electronic components on the vehicle. It is advantageous here that all the semiconductors of a topological switch can be switched with the same driver module.

Figure 3:
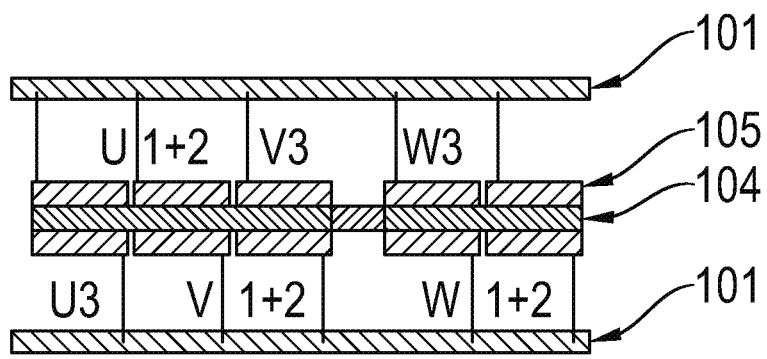
FIGS. 3, 4, and 5 show schematic views of a high-side and low-side branch from the DC or AC tapping point side according to different embodiments of the present invention.
Figure 4:
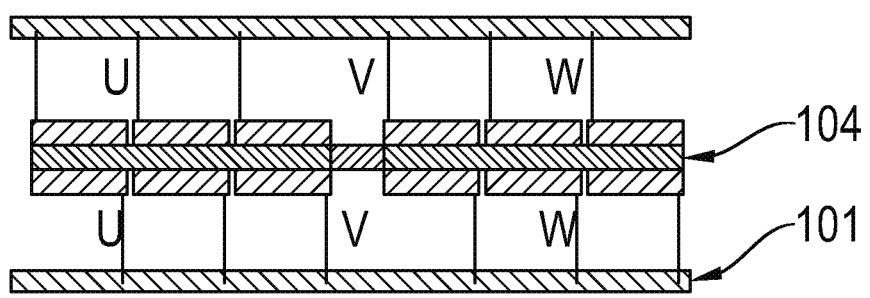
Figure 5:
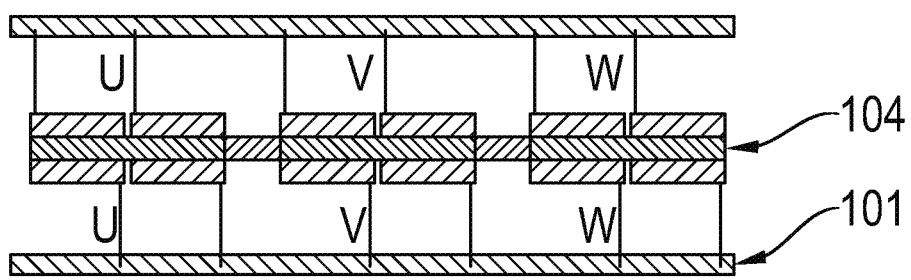

Alternatively, as indicated schematically in FIGS. 3 to 5 (view of the low-side branch and the cooling branch 104 from the side of the AC tapping point from FIG. 1), semiconductor packages 11, 12 of one or more phases U, V, W (with associated semiconductor packages U1-3; V1-3; W1-3) can be arranged on both sides, i.e. mutually opposite sides (surfaces) of heat sinks 10, of the respective cooling branch 103, 104, wherein low-side switches are always arranged in the low-side cooling branch 104 and high-side switches are always arranged in the high-side cooling branch 103. Embodiments are shown in FIGS. 3 to 5 in which three phases U, V, W are present, this also being the preferred number of phases. Two heat sinks, one of which is associated with a single phase W and the other of which is associated with two phases U, V, are provided in the cooling branch 104 in FIG. 3. Two heat sinks, one of which is associated with a single phase U and the other of which is associated with a further single phase W, are provided in the cooling branch 104 in FIG. 4, wherein the two heat sinks 10 are also associated with the phase V such that the phase V is assigned to two heat sinks 10. In FIG. 5, one heat sink 10 is provided per phase U, V, W. The semiconductor packages 11, 12 are contacted with the driver board 101 of the respective side of the cooling branch 104.

In principle and independently of the exemplary embodiments explained, the following configurations of this section are, inter alia, particularly advantageous. All the semiconductor packages 11, 12 of a phase U, V, W are arranged on one side of the cooling branch 103, 104. The semiconductor packages 11, 12 of a phase U, V, W are arranged opposite each other, for example are arranged in pairs opposite each other, i.e. on opposite sides of a cooling branch 103, 104. The number of semiconductor packages 11, 12 of a phase U, V, W on the opposite sides of the cooling branch 103, 104 is the same or different. In particular, in the case of semiconductor packages 11, 12, arranged on both sides of a cooling branch 103, 104, of a phase U, V, W, the number on one side is 1 or 2 greater than on the other side. In the case of a split cooling branch 103, 104, all the semiconductor packages 11, 12 of a phase U, V, W are arranged on the same or on a plurality of contacting regions.

The cooling branches 103, 104 of the heat sink 10 are characterized by a minimal structural height. Thus, the total height of this geometry is comparable to an inverter structure according to the prior art. However, approximately 30% higher power density at the power stage level is enabled as a result.

Figure 6:
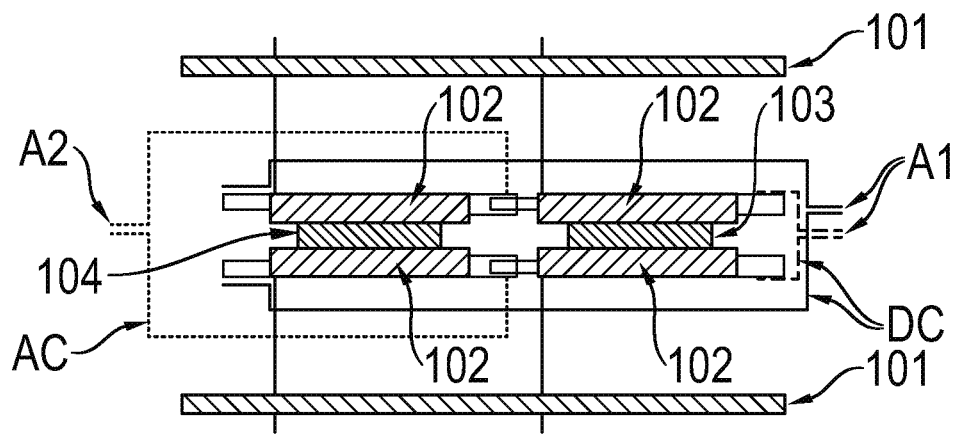
FIGS. 6, 7, and 8 show schematic views of busbar arrangements according to different embodiments of the present invention.

By virtue of the proposed structure and the resulting low design of the cooling system 10; 103, 104, the load-conducting busbars (DC busbars DC) can be grouped together in the region of the intermediate circuit 106 to form a common connection point A1, as indicated in FIGS. 2, 6, and 8.

The AC busbar region can also have a common connection point A2, as indicated in FIGS. 6 and 8. It is also possible here (not shown in FIG. 6) for there to be a connection between the half-bridges 102 instead of a connection via the outer sides of the half-bridges 102, as long as the fastening is possible.

In an alternative embodiment, as illustrated in FIG. 7 in a view in a direction from the intermediate circuit 106 and in FIG. 8 as a side view (corresponding to the view in FIG. 6), the semiconductor packages 11, 12 can also be arranged rotated by 90 degrees, wherein a higher number of heat sinks 10 are then required (six in the case of a three-phase system).

The high-side switch and low-side switch of the half-bridges 102 comprise one or more power semiconductor components such as an IGBT or MOSFET. The bridge circuit formed from the half-bridges 102 can be contacted with the driver boards 101 electrically and/or by signals such that the power switches can be connected electrically and/or by signals, by means of electrical contacts present on the component side of the circuit board of the respective driver board 101, with a control device such as an electronic control unit (ECU) of the motor vehicle 200. The control device is therefore capable of activating the power switches 11 and 12 for the purpose of operating the electric drive, in particular for the purpose of supplying current to the electric machine, of a motor vehicle 200 equipped with a corresponding drive. The circuit board can have a board (for example a PCB) or a flexible circuit board.

An embodiment of a structure of a power electronics module 100 with an inverter 1 with four phases U, V, W, X (FIG. 1), one phase U (FIG. 2), and three phases U, V, W (FIGS. 3 to 5), as well as two or three half-bridges 102, is illustrated in the Figures in order to exemplify a principle of the present disclosure. However, more or fewer phases can also be provided, for example two or three or a multiple thereof, for example six, nine, twelve, etc. A B6 module can also be implemented. More or fewer half-bridges 102 can also be provided.

Moreover, different power semiconductors can be used, for example Si IGBTs, SiCMOSFETs, SiC cascodes, GaNs. Also, several different types of semiconductor can be used at the same time inside the power electronics module 100, for example Si IGBTs and SiC MOSFETs.

Figure 9:
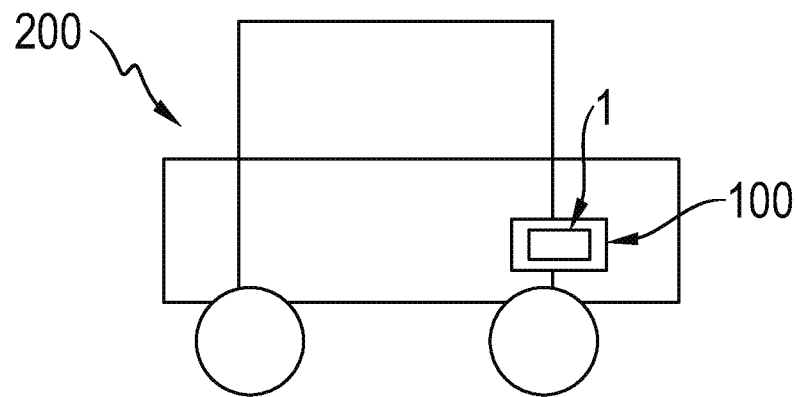
FIG. 9 shows a motor vehicle with an inverter and a power electronics module according to an embodiment of the present invention.

A power electronics module 100 within the scope of the present disclosure serves to operate an electric motor of a motor vehicle 200 driven by means of a battery or a fuel cell, as indicated in FIG. 9. The motor vehicle 200 is in particular a commercial vehicle such as a truck or a bus, or a car. The power electronics module 100 comprises a DC/AC inverter 1 with the described structure. It can also comprise an AC/DC rectifier, a DC/DC converter, a transformer, and/or a different electrical converter or part of such a converter, or be part thereof. In particular, the power electronics module 100 serves to supply current to an electric machine, for example an electric motor and/or a generator. A DC/AC inverter preferably serves to generate a multiphase alternating current from a direct current generated by means of a DC voltage of an energy source, for example a battery. A DC/DC converter serves, for example, to convert (increase) a direct current coming from a fuel cell into a direct current which can be used by the drive.

DC/DC converters and inverters 1 for electric drives (e-drives for short) of motor vehicles 200, in particular cars and commercial vehicles, as well as buses, are designed for the high-voltage range and are designed in particular for a reverse voltage class of approximately 650 volts and above.

The inverter arrangement described finds application, for example, in motor vehicles 200. The motor vehicle 200 can have in particular an electrically driven axle. The motor vehicle 200 can in principle take the form of a motor vehicle 200 powered only by an internal combustion engine, a hybrid motor vehicle, or an electric vehicle.

LIST OF REFERENCE SIGNS 1 inverter
100 power electronics module
200 motor vehicle
101 driver boards
102 half-bridge
11, 12 high-side/low-side semiconductor package
111, 121 cooling attachment
10 heat sink
103, 104 cooling branches
105 further components to be cooled
106 intermediate circuit
DC DC busbars
AC AC busbars
A1, A2 common DC or AC connection point
U, V, W, X phases

The invention claimed is:

1. An inverter of a power electronics module for activating an electric drive of a motor vehicle, the inverter comprising:
at least one phase;

two driver boards situated opposite each other;

at least one half-bridge arranged between the two driver boards and thus contacted electrically and/or by signals, with, in each case, a semiconductor package formed as a high-side switch and a semiconductor package arranged parallel thereto and formed as a low-side switch, wherein the high-side switch forms a high-side branch and the low-side switch forms a low-side branch; and at least one heat sink in a region of the at least one half-bridge and connected thermally conductively to a cooling attachment situated on an underside of each semiconductor package, wherein the heat sink has a split design such that at least a first cooling branch thereof is arranged in the high-side branch and at least a second cooling branch thereof is arranged in the low-side branch, wherein the first cooling branch of the high-side branch and the second cooling branch of the low-side branch are arranged at a distance from each other, and the first cooling branch and the second cooling branch are fluidically interconnected in parallel or in series in a region outside the arrangement of the semiconductor packages.

2. The inverter according to claim 1, comprising:
a plurality of phases, wherein each cooling branch of the plurality of phases is designed as a single part or as multiple parts and comprises a fastening to one of the driver boards between the phases.

3. The inverter according to claim 1, wherein each cooling branch is dimensioned in such a way that its width corresponds to no more than a length of the cooling attachment between an AC and DC tapping point of the semiconductor package.

4. The inverter according to claim 1, wherein the semiconductor packages of the at least one phase are arranged on a same side of the associated cooling branch.

5. The inverter according to claim 1, wherein the semiconductor packages of the at least one phase are arranged on opposite sides of the associated cooling branch.

6. The inverter according to claim 1, wherein semiconductor packages of a first phase and a second phases of the at least one phase are arranged on one side of the cooling branch, and semiconductor packages of a third phase of the at least one phase are arranged on an opposite side of the cooling branch.

7. The inverter according to claim 6, comprising an additional phase provided at a region of a cooling branch on which no semiconductor package is present.

8. The inverter according to claim 6, wherein at least one further component is connected thermally conductively to the cooling branch at a region of the cooling branch on which no semiconductor package is present and is configured to supply active or passive discharging.

9. The inverter according to claim 6, wherein AC busbars of each phase are arranged next to one another in such a way that AC busbars of the first phase and the second phase, the semiconductor packages of which are arranged on a same side of the cooling branch, are adjacent to each other.

10. The inverter according to claim 6, wherein an AC busbar of the third phase, the semiconductor packages of which are arranged on an opposite side of the cooling branch, is arranged between AC busbars of the first phase and the second phase, the semiconductor packages of which are arranged on a same side of the cooling branch as each other.

11. The inverter according to claim 1, wherein AC tapping points of the semiconductor packages of the low side and the high side are connected at a common connection point.

12. The inverter according to claim 1, wherein one, two, three, or four half-bridges are provided per phase of the at least one phase.

13. The inverter according to claim 1, wherein the semiconductor packages are arranged in such a way that each DC connector faces an intermediate circuit capacitor to be connected thereto.

14. The inverter according to claim 1, wherein the semiconductor packages are arranged in such a way that each DC connector have an angle of essentially 90 degrees to an intermediate circuit capacitor to be connected thereto.

15. The inverter according to claim 1, wherein semiconductor packages are arranged on mutually opposite sides of heat sinks of the associated cooling branch, and wherein a structural height of the heat sink is selected such that DC busbars of the semiconductor packages are connected at a common connection point and are electrically contacted with an intermediate circuit.

16. A power electronics module for activating an electric drive of a motor vehicle, comprising:
the inverter according to claim 1.

17. An electric drive for a motor vehicle comprising:
at least one electric machine;
a transmission device; and
the power electronics module according to claim 16.

18. A motor vehicle comprising the electric drive according to claim 17.

* * * * *